(12) United States Patent
Yeh

(10) Patent No.: US 6,610,600 B2
(45) Date of Patent: Aug. 26, 2003

(54) DAMASCENE COPPER ELECTROPLATING PROCESS WITH LOW-PRESSURE PRE-PROCESSING

(76) Inventor: Tsung-Kuang Yeh, 6F, No. 31, Pai Nian 2nd St., Lung Tan Hsiang, Taoyuan Hsien (TW)

( * ) Notice: Subject to any disclaimer, the term of this patent is extended or adjusted under 35 U.S.C. 154(b) by 19 days.

(21) Appl. No.: 10/057,960

(22) Filed: Jan. 29, 2002

(65) Prior Publication Data

US 2003/0143842 A1 Jul. 31, 2003

(51) Int. Cl.[7] ............................................. H01L 21/44
(52) U.S. Cl. ....................................... 438/678; 438/687
(58) Field of Search ................................. 205/913–925, 205/88–110, 120–127, 138, 152, 170; 428/935; 204/194; 427/8–98; 438/678, 687, 700, 637–641

(56) References Cited

U.S. PATENT DOCUMENTS 4,895,633 A * 1/1990 Seto et al. .................. 204/207
5,368,634 A * 11/1994 Hackett ........................ 95/260
6,241,869 B1 * 6/2001 Maeda ........................ 205/137

* cited by examiner

Primary Examiner—Matthew Smith
Assistant Examiner—Calvin Lee
(74) Attorney, Agent, or Firm—Rosenberg, Klein & Lee

(57) ABSTRACT

A damascene copper electroplating process with low-pressure pre-processing for fabricating interconnect structures on wafers comprising the following steps: a. closing two control valves to stop circulation of a plating solution; b. conveying a wafer to be plated on a predetermined location in a hallow container; c. venting the hallow container until the pressure inside the hallow container reaching a predetermined low pressure and then dipping the wafer into the plating solution; d. introducing external air until the pressure inside the hallow container reaching standard value; e. opening the two control valves to re-circulate the plating solution; f. repeating steps a to e for next wafer. The new process can reduce void defects and gap defects on wafers.

4 Claims, 5 Drawing Sheets

DAMASCENE COPPER ELECTROPLATING PROCESS WITH LOW-PRESSURE PRE-PROCESSING

BACKGROUND OF THE INVENTION

1. Field of the Invention

The present invention relates to a damascene copper electroplating process with low-pressure pre-processing for fabricating interconnect structures on wafers, especially to a damascene copper electroplating process with low-pressure pre-processing for fabricating interconnect structures on wafers to reduce possible void and gap defects on a wafer.

2. Description of the Prior Art

The damascene copper electroplating process for fabricating interconnect structures on wafers has become popular in recent year. The current damascene copper electroplating process for fabricating interconnect structures on wafers is generally conducted at standard pressure (e.g. 1 atm. pressure) such that air is liable to remain in the plating solution and the trenches of the wafer. Therefore, the wafer may have void and gap defects after the damascene copper electroplating process.

As, shown in FIG. 1, when the wiring on the wafer 1a becomes thinner and the groove A on the wafer 1a will have a large aspect ratio (depth/width ratio). Subsequently, the problem of the void defect C and gap defect D becomes more serious. FIG. 2 shows that a wafer 1a is dipped in a plating solution 3a under standard pressure 2a. FIG. 3 shows that air bubbles B are formed on the surface of the wafer 1a when the wafer 1a is dipped in a plating solution 3a under standard pressure 2a. FIG. 4 shows that void defect C and gap defect D on Cu-layer 4a are formed due to the air bubbles B after the damascene copper electroplating process is completed.

The current solution to above problem is to dispose the wafers 1a found with the void C and gap defect D. However, the wafers 1a are wasted

SUMMARY OF THE INVENTION

It is the object of the present invention to provide a damascene copper electroplating process with low-pressure pre-processing for fabricating interconnect structures on wafers to reduce void and gap defects on the wafer.

In one aspect of the invention, the present invention provides a damascene copper electroplating apparatus with low-pressure pre-processing for fabricating interconnect structures on wafers. The damascene copper electroplating apparatus with low-pressure pre-processing comprises a hollow container, a venting tube, a venting control valve, a venting pump, an admission tube, an admission control valve, a transparent window, a plating solution inlet, a plating solution outlet, two control valves for controlling the flowing circuitry of the plating solution, a plating tank, and a sealing door.

In another aspect of the invention, the present invention provides a damascene copper electroplating process with low-pressure pre-processing for fabricating interconnect structures on wafers. The damascene copper electroplating process with low-pressure pre-processing comprises following steps: a. closing the two control valves to stop circulation of the plating solution; b. conveying a wafer to be plated on a predetermined location in a hollow container; c. venting the hollow container until the hollow container has a predetermined low pressure and then dipping the wafer into the plating solution; d. introducing external air until the pressure inside the hollow container has reached the standard value (e.g. 1 atm); e. opening the two control valves to re-circulate the plating solution; f. repeating steps a to e for next wafer.

The various objects and advantages of the present invention will be more readily understood from the following detailed description when read in conjunction with the appended drawing, in which:

DETAILED DESCRIPTION OF THE INVENTION

Figure 1:
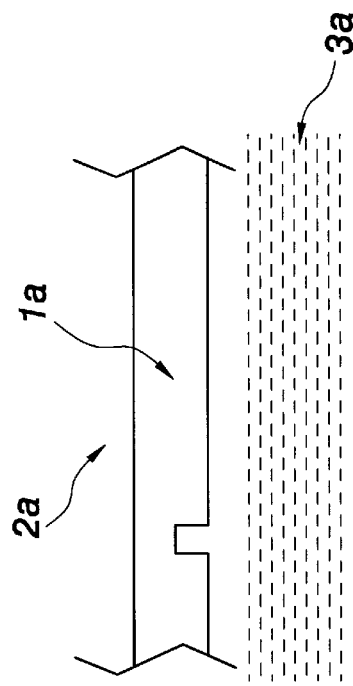
FIG. 1 is a sectional view showing a conventional damascene electroplating process for fabricating interconnect structures on a wafer.
Figure 2:
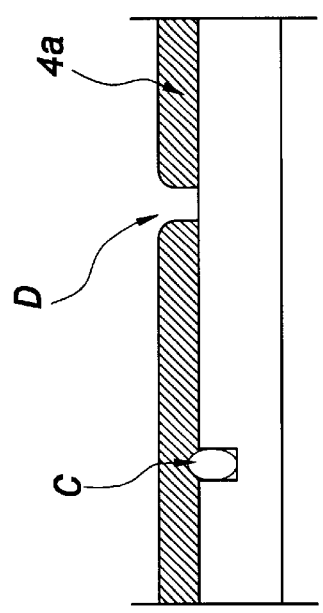
FIG. 2 is another sectional view showing the conventional damascene electroplating process for fabricating interconnect structures on a wafer.
Figure 3:
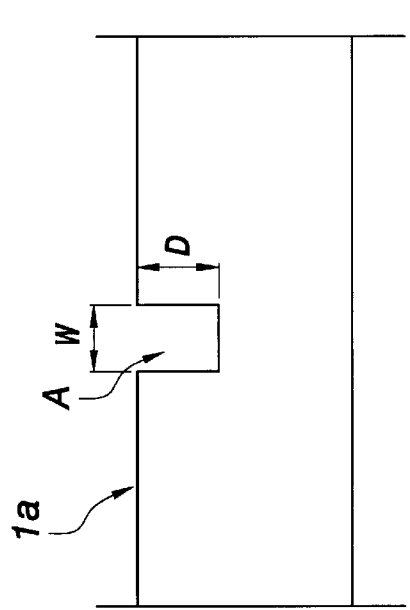
FIG. 3 is another sectional view showing the conventional damascene electroplating process for fabricating interconnect structures on a wafer.
Figure 4:
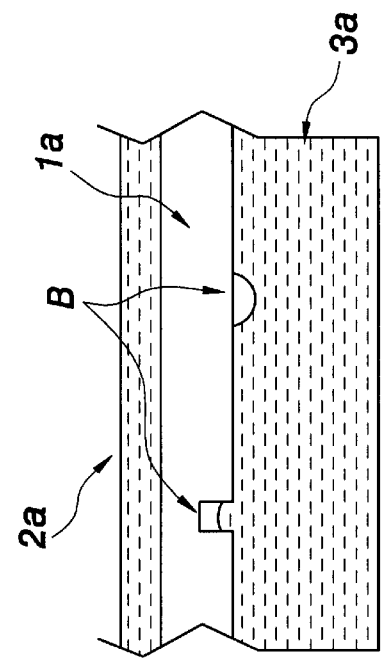
FIG. 4 is another sectional view showing the conventional damascene electroplating process for fabricating interconnect structures on a wafer.
Figure 5:
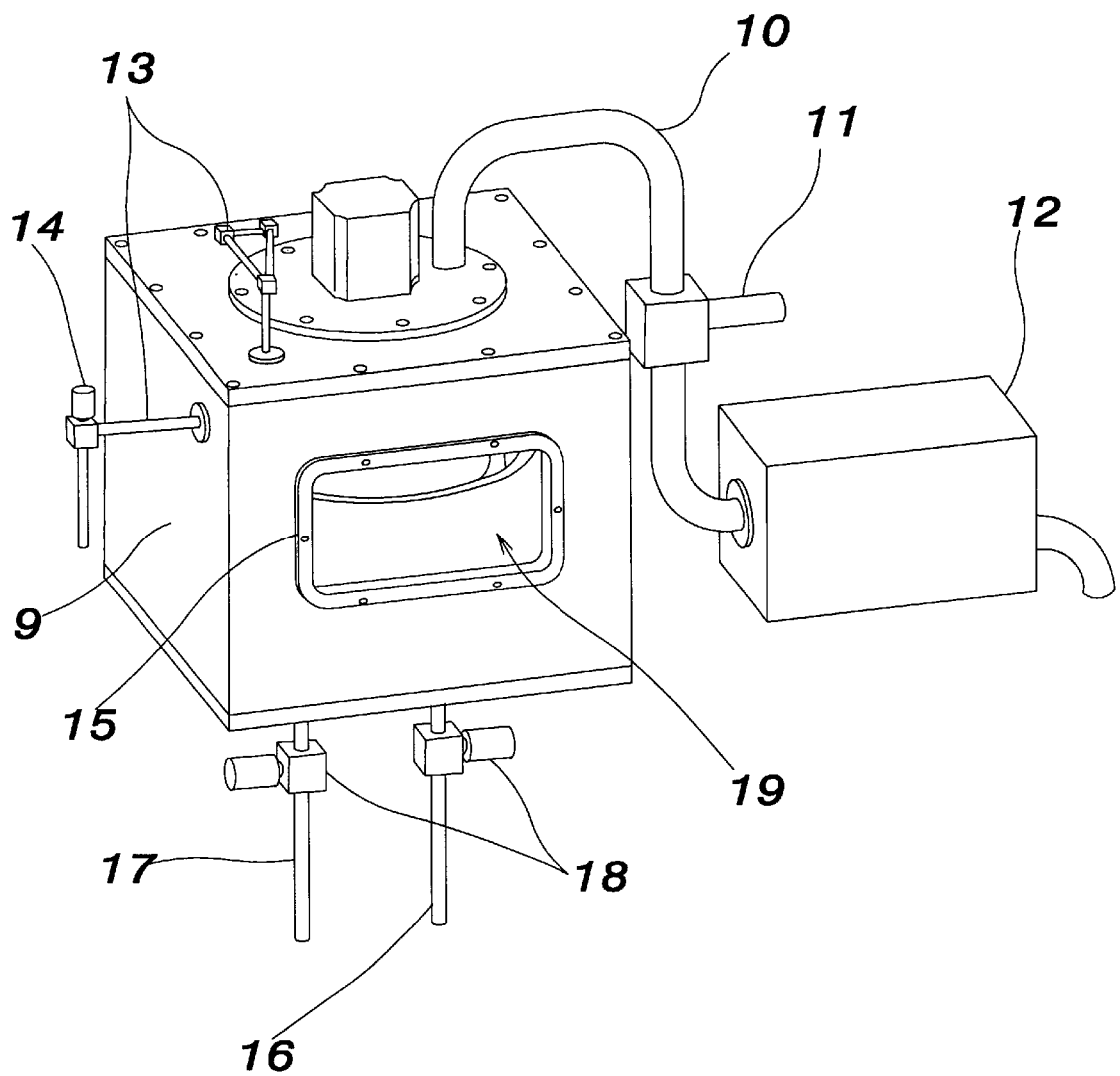
FIG. 5 is a perspective view of the damascene copper electroplating apparatus with low-pressure pre-processing of the present invention.
Figure 6:
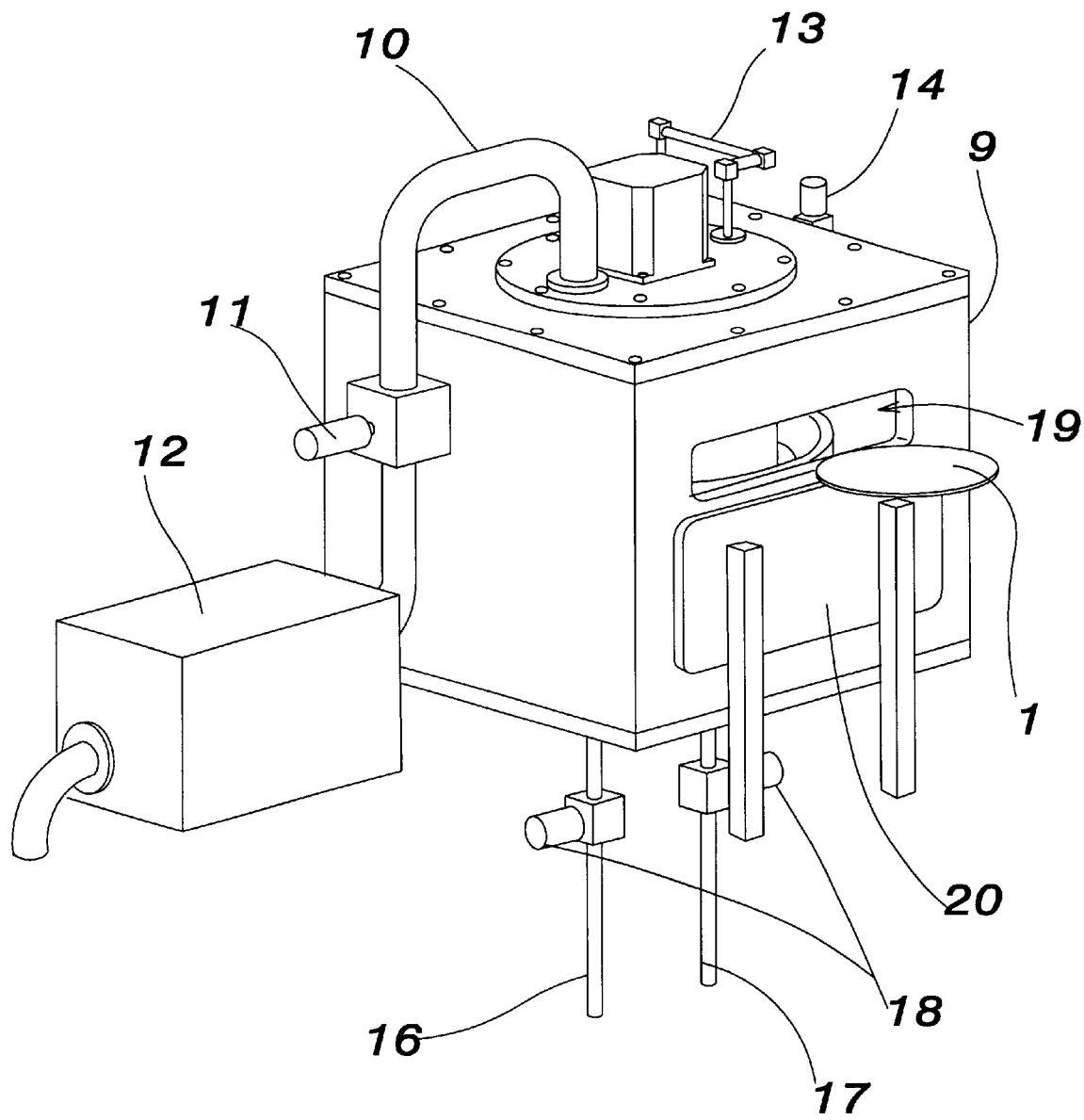
FIG. 6 is a perspective view showing a operation of the damascene copper electroplating apparatus with low-pressure pre-processing of the present invention.
Figure 7:
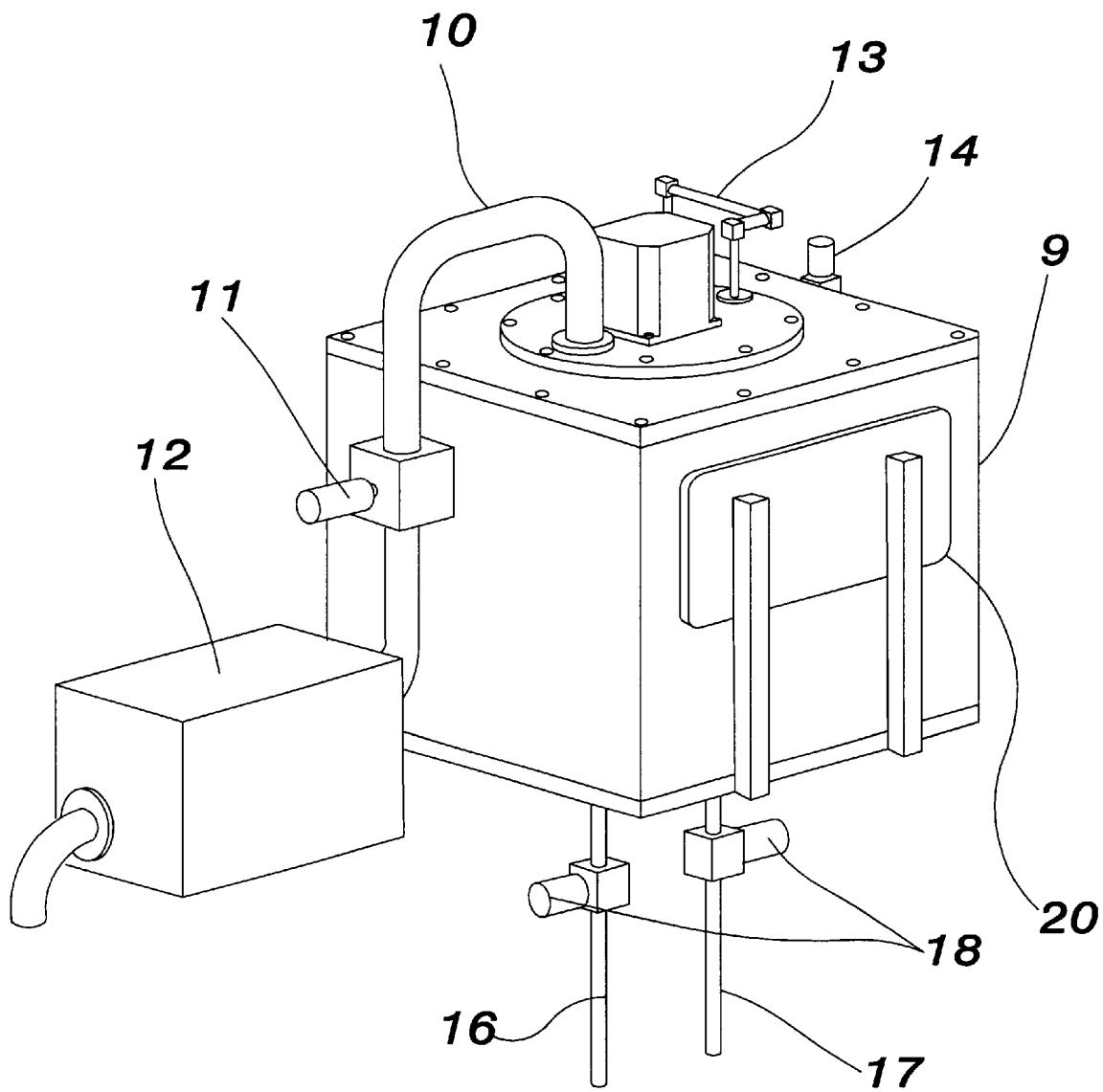
FIG. 7 is another perspective view showing the operation of the damascene copper electroplating apparatus with low-pressure pre-processing of the present invention.

The present invention is intended to provide a damascene copper electroplating apparatus with low-pressure pre-processing for fabricating interconnect structures on wafers. With reference now to FIGS. 5 to 7, the damascene copper electroplating apparatus with low-pressure pre-processing according to the present invention comprises a hollow container 9, a venting tube 10, a venting control valve 11, a venting pump 12, an admission tube 13, an admission control valve 14, a transparent window 15, a plating solution inlet 16, a plating solution outlet 17, two control valves 18 for controlling the flowing,circuitry of the plating solution, a plating tank 19, and a sealing door 20.

The hollow container 9 is used to receive a wafer 1 to be plated. The venting tube 10 has one end connected to topside of the hollow container 9 and another end connected to the venting pump 12 to convey pumped-out air. The venting control valve 11 is connected to the venting tube 10 to aid the air pumping operation and to maintain a predetermined low pressure(under 1 atm) in the hollow container 9. The venting pump 12 is connected to one end of the venting tube 10 for drawing air out of the hollow container 9 to reduce the pressure in the hollow container 9. The admission tube 13 is connected to topside and lateral side of the hollow container 9 and used to introduce air into the hollow container 9 to achieve a standard pressure(1 atm). The admission control valve 14 is connected to the admission tube 13 on lateral side of the hollow container 9 and controls the air introduced into the hollow container 9. The transparent window 15 is provided at the front side of the hollow container 9 through which the plating of the wafer 1 can be observed. The plating solution inlet 16 is connected to the plating tank 19 in the hollow container 9 and introduces a plating solution into the plating tank 19, wherein the plating solution is an electrolytic solution containing copper ions. The plating solution outlet 17 is connected to the plating tank 19 in the hollow container 9 and drains the used plating solution out of the plating tank 19 to ensure plating quality. The control valves 18 are connected to the plating solution inlet 16 and the plating solution outlet 17 to control the flow of the plating solution into and out of the plating tank 19. The plating tank 19 is placed in the hollow container 9 and the sealing door 20 is on the rear side of the hollow container 9 through which the wafer 1 is put into the hollow container 9.

Figure 9:
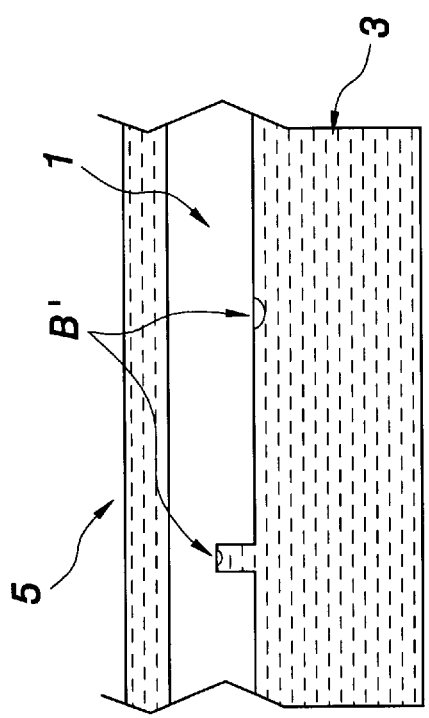
FIG. 9 is another sectional view showing the process of the damascene copper electroplating with low-pressure pre-processing for fabricating interconnect structures on a wafer of the present invention.
Figure 11:
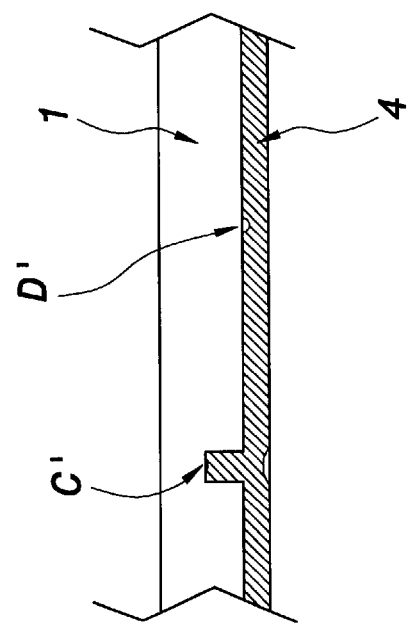
FIG. 11 is another sectional view showing the process of the damascene copper electroplating with low-pressure pre-processing for fabricating interconnect structures on a wafer of the present invention.
Figure 8:
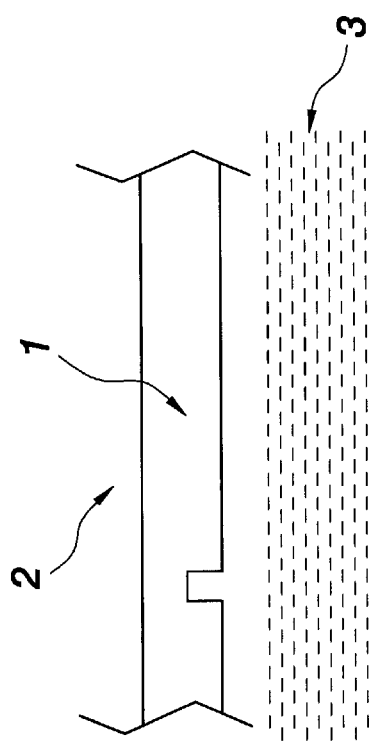
FIG. 8 is a sectional view showing the process of the damascene copper electroplating with low-pressure pre-processing for fabricating interconnect structures on a wafer of the present invention.
Figure 10:
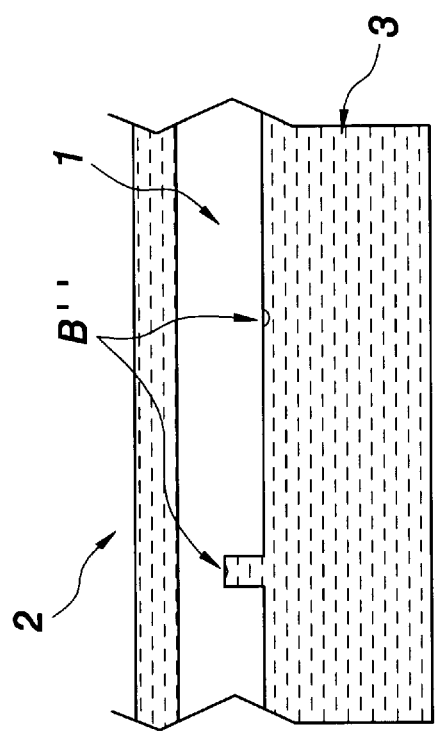
FIG. 10 is another sectional view showing the process of the damascene copper electroplating with low-pressure pre-processing for fabricating interconnect structures on a wafer of the present invention.

The operation steps of the damascene copper electroplating apparatus with low-pressure pre-processing for fabricating interconnect structures on wafers are as follows:

a. Close the control valve 18 on the plating solution inlet 16 and the control valve 18 on the plating solution outlet 17 to stop the circulation of the plating solution.

b. Open the sealing door 20 and place the wafer 1 to be plated into the hollow container 9 as shown in FIG. 8, place the wafer 1 atop the plating solution 3, and close the sealing door 20.

c. Close the admission control valve 14 and open the venting control valve 11. Operate the venting pump 12 until the pressure inside the hollow container 9 reaches a pre-determined low pressure 5(under 1 atm) and most air in the groove of the wafer and the plating solution 3 is removed. In the meantime, a part of the electrolyte will vaporize due to the pressure drop that in turn changes the ingredient of the gas phase in the hollow container 9 from high air content with low vaporized electrolyte content to high vaporized electrolyte content with low air content. Dip the wafer 1 into the plating solution 3 for plating. Because the vaporized electrolyte is dissolvable in the electrolyte, only smaller bubbles B' remain on the wafer 1 as shown in FIG. 9.

d. Open the admission control valve 14 to achieve a standard pressure(1 atm) in the hollow container 9 by inhaling external air, and the bubbles B' become much smaller bubbles B" due to increased pressure in the hollow container 9, as shown in FIG. 10.

e. Open the two control valves 18 to re-circulate the plating solution 3 and begin to plate the wafer 1. It will result in a much smaller void defect C' on the wafer 1 and a much smaller gap defect D' on Cu-layer 4, as shown in FIG. 11.

f. Repeat steps a to e for next wafer if the electroplating process for the wafer 1 is completed.

Steps a–f can be performed by computerized auto-control mechanism. The predetermined low pressure 5 is from 0.01 to 0.9 atm and the damascene copper electroplating process with low-pressure pre-processing for fabricating interconnect structures on wafers is suitable for various generations of the technology including 0.15 $\mu$m, 0.13 $\mu$m, 0.1 $\mu$m, and sub-0.1 $\mu$m.

As can be seen from above description, the air bubbles attached on the wafer become much smaller by the damascene copper electroplating with low-pressure pre-processing. Therefore, the void defect on the wafer and gap defect on Cu-layer also become much smaller. The yield is enhanced and waste of material can thus be prevented.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

I claim:

1. A damascene copper electroplating process with low-pressure pre-processing for fabricating interconnect structures on wafers comprising following steps:

a. closing two control valves to stop circulation of a plating solution;

b. conveying a wafer to be plated on a predetermined location in a hollow container;

c. venting the hollow container until the hollow container has a predetermined low pressure and then dipping the wafer into the plating solution;

d. introducing external air until the hollow container has a standard pressure;

e. opening the two control valves to re-circulate the plating solution to plate the wafer;

f. repeating steps a to e for a next wafer.

2. The damascene copper electroplating process with low-pressure pre-processing for fabricating interconnect structures on wafers as in claim 1, wherein the plating solution is an electrolytic solution containing copper ions.

3. The damascene copper electroplating process with low-pressure pre-processing for fabricating interconnect structures on wafers as in claim 1, wherein the predetermined low pressure is from 0.01 to 0.9 atmosphere.

4. The damascene copper electroplating process with low-pressure pre-processing for fabricating interconnect structures on wafers as in claim 1, wherein the interconnect structures on wafers can be of various generations of the technology including 0.15 $\mu$m, 0.13 $\mu$m, 0.1 $\mu$m, and sub-0.1 $\mu$m.

* * * * *